United States Patent
Chen et al.

(10) Patent No.: US 6,946,667 B2
(45) Date of Patent: Sep. 20, 2005

(54) APPARATUS TO DECELERATE AND CONTROL ION BEAMS TO IMPROVE THE TOTAL QUALITY OF ION IMPLANTATION

(75) Inventors: Jiong Chen, San Jose, CA (US); Zhming Wan, Sunnyvale, CA (US); Qing Qian, San Jose, CA (US)

(73) Assignee: Advanced Ion Beam Technology, Inc., Sunnyvale, CA (US)

( * ) Notice: Subject to any disclaimer, the term of this patent is extended or adjusted under 35 U.S.C. 154(b) by 318 days.

(21) Appl. No.: 10/299,443

(22) Filed: Nov. 19, 2002

(65) Prior Publication Data

US 2003/0066976 A1 Apr. 10, 2003

Related U.S. Application Data

(63) Continuation-in-part of application No. 09/516,663, filed on Mar. 1, 2000, now Pat. No. 6,489,622.

(51) Int. Cl.$^7$ .............................. G21K 5/10; H01J 37/08
(52) U.S. Cl. ................................................. 250/492.21
(58) Field of Search ......................... 250/492.2, 492.21, 250/489

(56) References Cited

U.S. PATENT DOCUMENTS

| 4,980,562 | A | * | 12/1990 | Berrian et al. | 250/492.2 |
|---|---|---|---|---|---|
| 5,196,706 | A | * | 3/1993 | Keller et al. | 250/396 R |
| 5,378,899 | A | * | 1/1995 | Kimber | 250/492.21 |
| 5,892,236 | A | * | 4/1999 | Takahashi et al. | 250/492.21 |
| 6,229,148 | B1 | * | 5/2001 | Prall et al. | 250/492.21 |
| 6,541,780 | B1 | * | 4/2003 | Richards et al. | 250/492.2 |
| 6,566,661 | B1 | * | 5/2003 | Mitchell | 250/489 |
| 6,573,517 | B1 | * | 6/2003 | Sugitani et al. | 250/492.21 |

* cited by examiner

*Primary Examiner*—John R. Lee
*Assistant Examiner*—Johnnie L Smith, II
(74) *Attorney, Agent, or Firm*—Bo-In Lin

(57) ABSTRACT

An ion implantation method is disclosed in this invention. The disclosed method is for implanting a target wafer with ions extracted from an ion source traveling along an original ion beam path. The method includes steps of a) employing a set of deceleration electrodes disposed along the original ion beam path before the target wafer for decelerating and deflecting the ion beam to the target wafer; and b) employing a charged particle deflecting means disposed between the ion source and the set of deceleration electrodes for deflecting the ion beam away from original ion beam path and projecting to the set of electrodes with an incident angle for the set of electrodes to deflect the ion beam back to the original ion beam path for implanting the target wafer.

27 Claims, 9 Drawing Sheets

APPARATUS TO DECELERATE AND CONTROL ION BEAMS TO IMPROVE THE TOTAL QUALITY OF ION IMPLANTATION

This application is a continuation-in-part and claims priority to pending U.S. formal patent application entitled "APPARATUS FOR DECELERATING ION BEAMS FOR REDUCING THE ENERGY CONTAMINATION" filed Mar. 1, 2000,by Chen et al. and accorded Ser. No. 09/516,663, now U.S. Pat. No. 6,489,622 the benefit of its filing date being hereby claimed under Title 35 of the United States Code.

BACKGROUND OF THE INVENTION

1. Field of the Invention

This invention relates generally to methods and apparatus for carrying out ion implantation with decelerated ion beams. Specifically, this invention relates to an improved methods and new configuration of implanter by employing striking means for the measurement and control of implant angles and to reduce cross contaminations.

2. Background

The ion implantation processes is often limited by a technical difficulty that the implant angle of the decelerated ion beam is not accurately measured and controlled. Another difficulties is related to the problems caused by cross contaminations when the ion implanter is often used to implant different kinds of ions. These technical difficulties and limitations can be better understood and appreciated by further discussions of the technical background involved in the processes and configurations of ion implanters as currently employed to perform the ion implantation tasks.

Ion implantation is a ballistic process used to introduce atoms or molecules, called dopants, to make materials with useful properties. In particular, ion implantation is a common process used in making modern integrated circuits. The amount of ion beam current that can be transported in a conventional ion implanter depends on the ion beam energy and at low energies becomes unfeasibly low.

For a conventional high current ion implanter, an ion beam is extracted from an ion source and travels through a mass analyzer magnet to select specific ionic species. The selected or filtered ion beam emerges from the magnet and is then incident toward the semiconductor target wafers. The travel distance from the source to the wafers is usually about two meters. For an ion beam with an energy as low as 0.2 keV and beam currents as high as 10 mA, the space charge of the beam is so intense that the ion beam starts to blow up severely as it leaves the source. This problem exists regardless of what kind of beam focusing optics is used. After the ion beam travels about two meters there is not much usable beam current left for implantation. An efficient way to obtain high beam currents at low ion energy is to decelerate an ion beam from higher energy, e.g., 5 keV, to a lower energy, e.g., 1, 0.5, or as low as 0.2 keV, at a region close to the wafers. Although the beam may also blow up after deceleration, there is still sufficient beam current remaining for implantation because the distance between the deceleration region and the wafers is usually less than 0.4 meters. With the use of a plasma or electron shower, the beam blow-up will be less and beam transmission can be improved.

The above method is able to achieve high beam currents at energies below 5 keV by extracting ions at a higher than desired final energy, conducting a mass analysis of the ions, and then decelerating the ion beam to the desired energy just before it reaches the target. However, high-energy neutrals can be generated in the region between the mass analyzer and the deceleration electrodes when higher energy ions have charge exchange interactions with residual gases in the beamline. These neutralized atoms will not be decelerated by the decelerating electric fields and will reach the wafers at higher than desired energies. This results in what is known as energy contamination, which causes a deeper than desired dopant depth profile. Energy contamination is only tolerable to ~0.1% in order to provide sufficient margin against shifts in device performance [L. Rubin, and W. Morris, "Effects of Beam Energy Purity on Junction Depths in Sub-micron Devices", Proceedings of International Conference on Ion Implantation Technology, 1996, p96]. To have such a low neutral fraction it requires that the chamber pressures be kept very low (5.0E-7 torr) so as to minimize the probability of charge exchange reactions. This level of pressure is, however, very difficult to maintain under normal operating conditions in an implantation system due to the out-gassing of the photo-resist coating of patterned devices and the presence of feed gases from the source and plasma shower. Another issue is the variation in the level of contamination. Pressure fluctuations during the implant can cause across wafer effects. Day-to-day changes in residual vacuum or photo-resist quality can cause batch-to-batch effects. Finally, the potential loss of wafers worth millions of dollars exists due to these types of undetected vacuum problems.

In order to prevent severe consequences resulting from energy contamination Adibi et al have invented a device to monitoring high-energy neutral contamination in an ion implantation process (U.S. Pat. No. 5,883,391). Although, the device disclosed by Adibi et al. may be useful to monitor and prevent damages resulted from contamination of neutral particles, the device however does not provide a technical solution that can produce a positive effect of reducing the energy contamination.

For the purpose of reducing energy contamination in decelerated beam implant, England (U.S. Pat. No. 5,969,366) discloses a method of installing a magnet in between deceleration electrodes and the implant target. The major obstacle of implementing this approach to an ion implanter is distance between the deceleration electrodes and the implant target is increased. Consequently, the production worth low energy beam currents cannot be properly delivered to the target. The added distance between the deceleration electrode and the target therefore degrades the performance of the implanter disclosed by England.

For the above reasons, in order to project a low energy high current ion beam to the target wafer, it is often required to deflect and guide the beam along a curved trajectory as will be discussed in FIG. 1 below. In the processes of bending and guiding the trajectories of the ion beam, the ion beam incident angle as that projected onto the target wafer is changed. The angular shift, however, is an important parameter to measure and control for the uniformity of the ion implantation but the conventional configuration and implant processes still lack an effective method to accurately measure the ion beam incident angle. Furthermore, an implanter is often applied for implanting different kinds of ions. Meanwhile, an ion implanter has an Faraday that is usually placed behind the target wafer with an ion collection surface to function as an ion beam current monitor as well as an ion beam dump. The ion collection surface often absorbs and contains different kinds of implanted particles. However, different kinds of the implanted particles as residual particles contained in the Faraday may be sputtered away from the ion collection surface when bombarded by the incident ions. Some of the residual sputtered particles may land on the surface of the target wafer and cause cross contamination and thus adversely affect the purity and quality of the ion implantation operations.

Therefore, a need still exists in the art of ion implantation to design an improved configuration and methodology to accurately measure the incident angle of the ion beam guided through curved trajectories when incident onto the target wafer and also to prevent cross contaminations when the implanter is employed for implanting different kinds of ions onto many kinds of wafers.

Furthermore, since the traditional techniques of ion implantation using conventional deceleration approaches as described above does not provide a viable solution for very low energy ion implantation. There is a need in the art of IC device fabrication to provide new systems to provide very low energy implants with minimal energy contamination. In order to manufacture devices that require shallow p-type and n-type junctions, new methods and systems are required to resolve the difficulties and limitations of low energy ion implantation with effective control over energy contamination.

SUMMARY OF THE PRESENT INVENTION

It is an object of the present invention to provide a striking plate with flexibly movable positions disposing in front of the ion collection surface of the Faraday to more accurately measure the incident angle of the ion beams and then applying the results of measurements to adjust the ion-deceleration electrodes or the intensity of the mass analyzer magnetic field to control the beam incident angle. The striking plates implemented in this invention are further useful to prevent cross contaminations. The new ion implantation configuration as disclosed in this invention thus enables a person of ordinary skill in the art to more accurately measure and control the ion incident angle and to significantly reduce the cross contaminations whereby the difficulties and limitations as that encountered in the prior art technologies are overcome.

It is another object of the present invention to provide a new ion implant system for very low energy (sub 2 keV) implants to form shallow p-type and n-type junctions in semiconductor devices. The new ion implant system has novel deceleration optics that will enable those of ordinary skill in the art to overcome the problems encountered in the prior art.

Another object of the present invention is to provide a new ion beam steering and deceleration system with magnetic deflecting means disposed between the mass analyzer magnet and the deceleration electrodes and the target wafer. The magnetic field generated between the mass analyzer magnet and the deceleration electrodes is applied to deflect the charged ion beam away from the original beam path for incident toward the deceleration electrodes with an incident angle. The deceleration electrodes then steer the charged ion beam back to the original beam path. Multiple neutral beam stoppers can be employed to more effectively block the neutral beams from reaching the target wafer.

Another object of the present invention is to provide a new ion beam steering and deceleration system with magnetic deflecting means disposed between the mass analyzer magnet and the deceleration electrodes and the target wafer. A small distance between the deceleration electrodes and the wafer target can be maintained without a requirement to provide a magnetic field between the deceleration electrodes and the target wafer. The deceleration electrodes can be provided with multiple electrodes for steering the charged ion beam back to the original beam path. Another neutral beam stopper can be placed immediately next to the deceleration electrodes to further block the neutral beam from reaching the target wafer.

Specifically, it is the object of the present invention to present a new ion beam steering deceleration and steering system for decelerating a charged ion beam and for separating the neutralized component, or neutral fraction, from the main ion beam. The charged ion beam is filtered and focused by the ion beam deceleration optics and becomes an angularly spread out beam with an angle of deflection that is dependent on the ion energy. In this way, the ion implant energy can be more accurately controlled and the neutral fraction can be removed. The neutral beam is unaffected by the decelerating electric fields and propagates in the same direction as the initial beam before deceleration. A neutralized-particle stop block then stops the neutrals before reaching the target wafer or target chamber. Energy contamination resulting from neutralized particles incident to the target with higher than desired energies is thus resolved. The electrodes of the beam deceleration optics are configured to move in a traverse direction relative to the beam line so that the beam can be steered to travel further away from both the neutralized and high-energy particles to assure that only low energy ions are employed for implantation.

Briefly, in a preferred embodiment, the present invention discloses an ion implantation apparatus. The ion implantation apparatus includes an ion source for extracting an ion beam to travel along an original ion beam path for implanting a target wafer. The apparatus further includes a set of deceleration electrodes disposed along the original ion beam path before the target wafer for decelerating and deflecting the ion beam to the target wafer. The ion implantation apparatus further includes a charged particle deflecting means disposed between the ion source and the set of deceleration electrodes for deflecting the ion beam away from original ion beam path and projecting to the set of electrodes with an incident angle for the set of electrodes to deflect the ion beam back to the original ion beam path for implanting the target wafer.

A method for implanting a target wafer with ions extracted from an ion source traveling along an original ion beam path is also disclosed. The method includes steps of a) employing a set of deceleration electrodes disposed along the original ion beam path before the target wafer for decelerating and deflecting the ion beam to the target wafer; and b) employing a charged particle deflecting means disposed between the ion source and the set of deceleration electrodes for deflecting the ion beam away from original ion beam path and projecting to the set of electrodes with an incident angle for the set of electrodes to deflect the ion beam back to the original ion beam path for implanting the target wafer.

These and other objects and advantages of the present invention will no doubt become obvious to those of ordinary skill in the art after having read the following detailed description of the preferred embodiment, which is illustrated in the various drawing figures.

DETAILED DESCRIPTION OF THE PREFERRED EMBODIMENT

Figure 1:
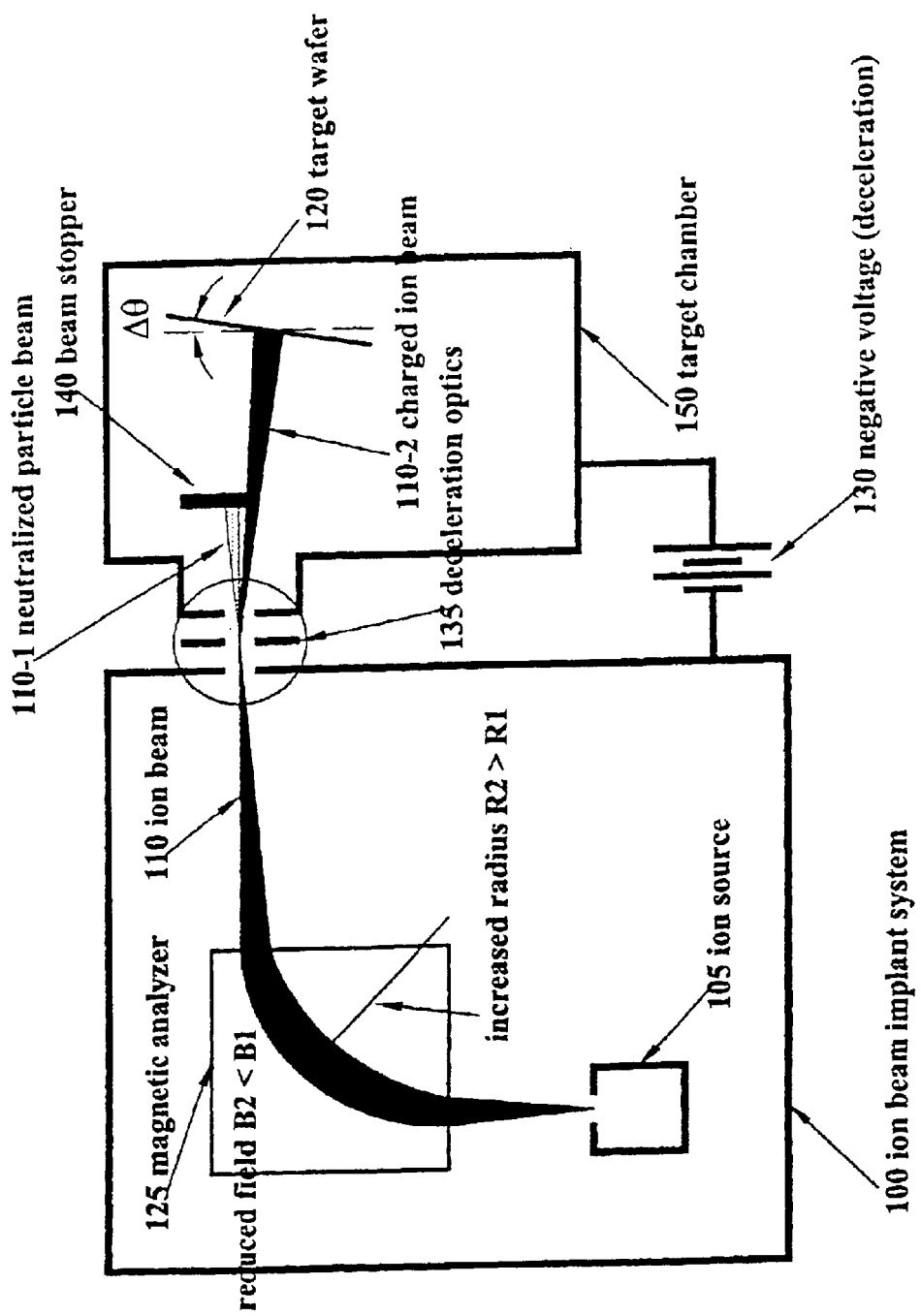
FIG. 1 is a functional block diagram showing how the deceleration optics of this invention separates a decelerated ion beam from the neutralized beam in an ion source implanter system.

FIG. 1 is a functional block diagram for showing the ion implant system 100 of this invention. The deceleration optics described below can decelerate an ion beam from high energy, e.g. 5 keV, to energy as low as 0.2 keV, and at the same time disperse the decelerated ion beam in an angular-spread-out beam according to the ion particle energy range. The angular-spread-out characteristic of the ion beam provides a convenient method for selectively blocking out the beam in a certain energy range by employing a simple mechanical means known as a beam stop. Referring to FIG. 1, the ion beam implant system 100 includes an ion source associated with ion-beam formation electrodes 105, the mass analyzer magnet 125, post analysis deceleration electrodes 135, and target chamber 150 for implanting a target wafer 120 with an ion beam 110.

Under normal operation (no ion beam deceleration), the ion beam 110, mass-filtered by the mass analyzer magnet 125, is transported through the decel electrodes 135 and reaches the wafer. In this situation, there is no voltage difference between the entrance electrode and exit electrode of the decel electrode assembly so that neither deceleration nor acceleration occurs for the ion beam. There is also no non-symmetric field applied in the region of the decel electrodes so that the ion beam is not steered away from the beamline symmetric axis.

Under the operation of ion beam deceleration, after the ion beam 110 passes through the magnetic analyzer 125, a deceleration voltage 130 is applied to decelerate the ion beam 110 as shown in FIG. 1. When the ion beam 110 is a positively charged ion beam, a negative voltage 130 is applied. As the ion beam 110 travels through the ion beam system 100, some charged particles may be neutralized. The deceleration voltage will not decelerate the neutralized particles because they do not carry a net charge. The energy and direction of such particles are not affected by the electric field. After passing through the deceleration optics 135 the path of the neutral particles and the charged particles are therefore separated during deceleration and become two separate beams 110-1 and 110-2. The neutral particle beam 110-1 travels along a straight line while the charged ion beam 110-2 becomes spread out by employing a special deceleration optics as will be discussed below. The charged ion beam becomes an angularly spread-out beam and travels along a path with a slightly downward angle, e.g., a six-degree downward angle, to reach the target wafer 120. Note that the charged ion-beam is spread out over an angular range depending on the energy of the ion particles as will be discussed below. A beam stop 155 is employed on the path of the neutralized particle beam 110-1 to block the neutralized beam 110-1 from reaching the target wafer 120. The target wafer 120 is placed with a small slant angle, e.g., a six-degree angle relative to a vertical direction of the perpendicularly facing charged ion beam 110-2. By putting a beam stop 155 after the deceleration optics, but in the original beam path 110-1, the neutral particles are blocked and hence removed. By making the steering angle sufficiently large (at least 3 degrees) the problem of energy contamination associated with the neutral fraction in charged ion beams can be overcome. In this way, the problem of energy contamination in decel-mode operation can be resolved.

Figure 2:
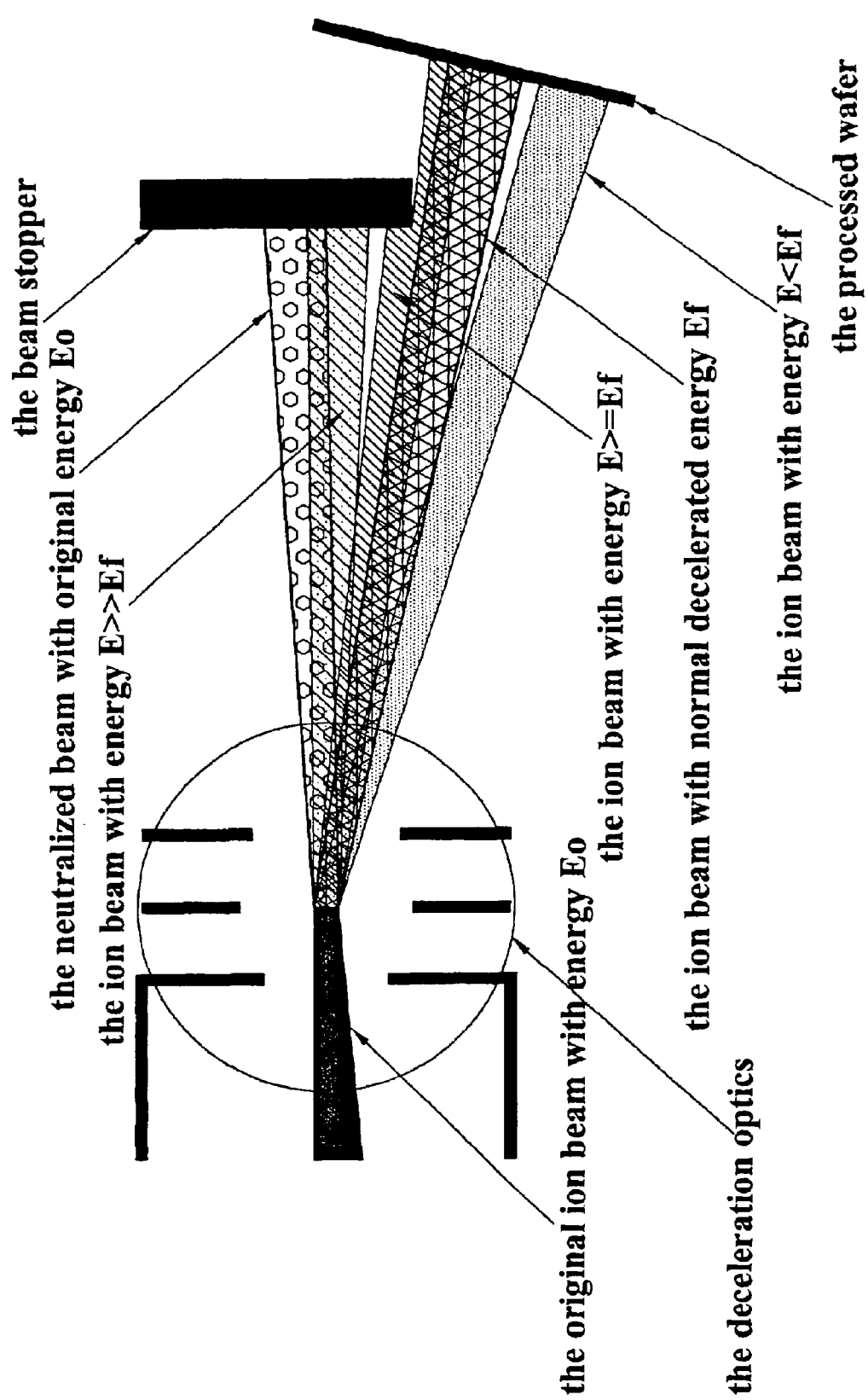
FIG. 2 is a functional block diagram showing how the deceleration optics of this invention acts as an energy filter.

Referring to FIG. 2, the angular spread of the ion beam generated by the deceleration optics provides a steering function that is specifically configured as an energy filter. For a given configuration of the deceleration optics, the individual ions in the beam will be deflected downward at a large (small) angle for ions having a relatively low (high) energy. Suppose that the steering angle is $\theta_O$ for ions with initial energy $E_O$ decelerated to a final energy $E_F$. The ion beam is typically composed of ions with a range of energies from $E_O-dE_1$ to $E_O+dE_2$, where $dE_1$ and $dE_2$ represent the lower and upper ion beam energy increment limits, respectively. Referring to FIG. 2, ions with energy much higher than $E_O$ will be deflected by a small deflection angle $\theta<<\theta_O$ and thus will be blocked by the upper part of the beam stop as shown in FIG. 2. Ions with higher energy, but close to $E_O$ will be partially blocked. Ions with energy smaller than $E_O$ will be blocked by the lower part of the beam stop although energy contamination is not as serious a problem for ions with energy much less than $E_O$. The problems caused by energy contamination can be significantly resolved with a beam stop 155 as that shown in FIGS. 1 and 2. Even during high voltage glitch conditions, which may cause the original ion beam to have a large energy range, the implant profile will not be adversely affected by energy contamination. The opening of the beam stop also defines the targeted ion-beam direction when the deceleration optics decelerates and steers the ion beam through the opening to the target wafer.

Figure 3:
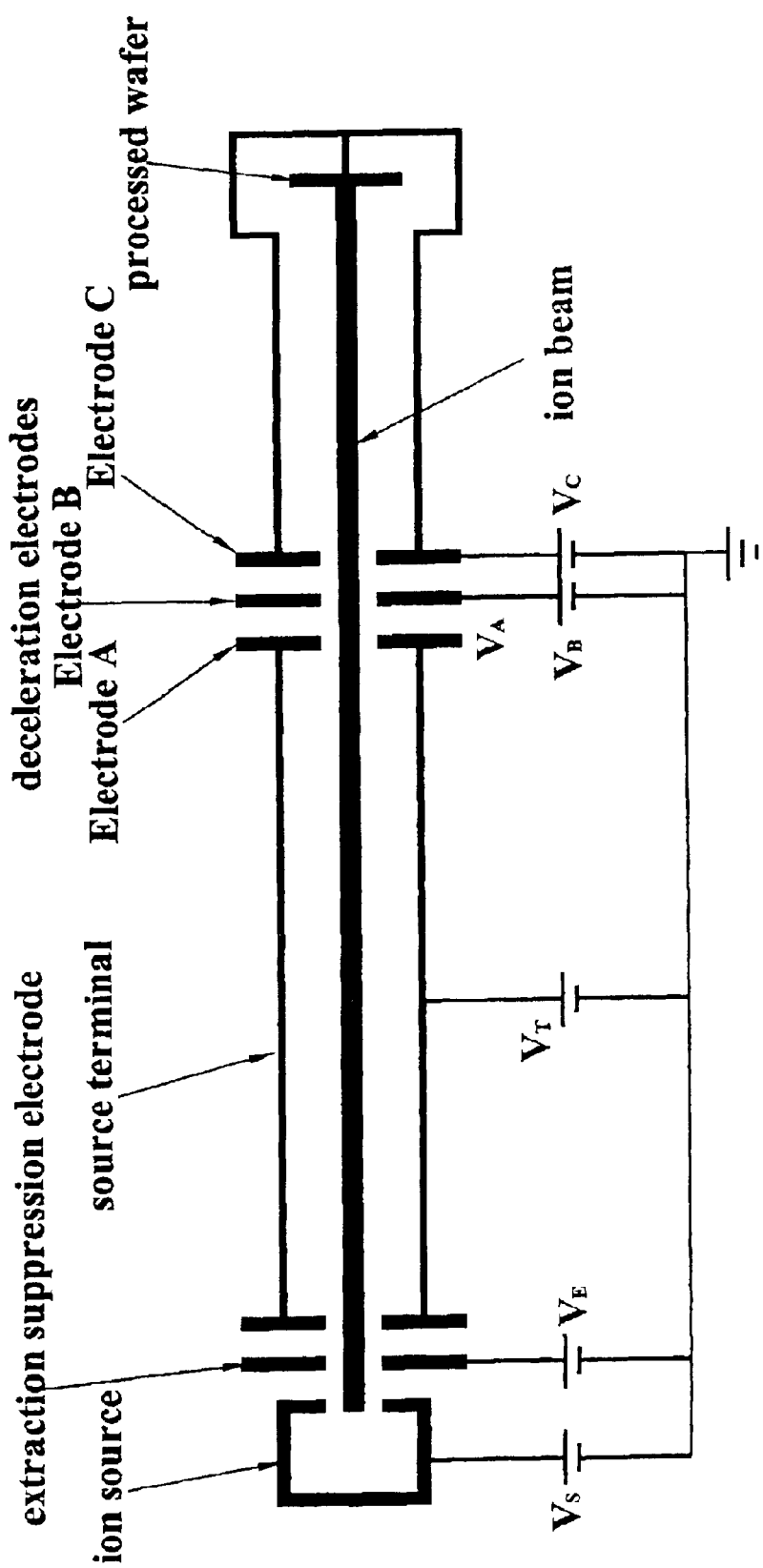
FIG. 3 is a schematic diagram of the major beam line components at different voltages.
Figure 4:
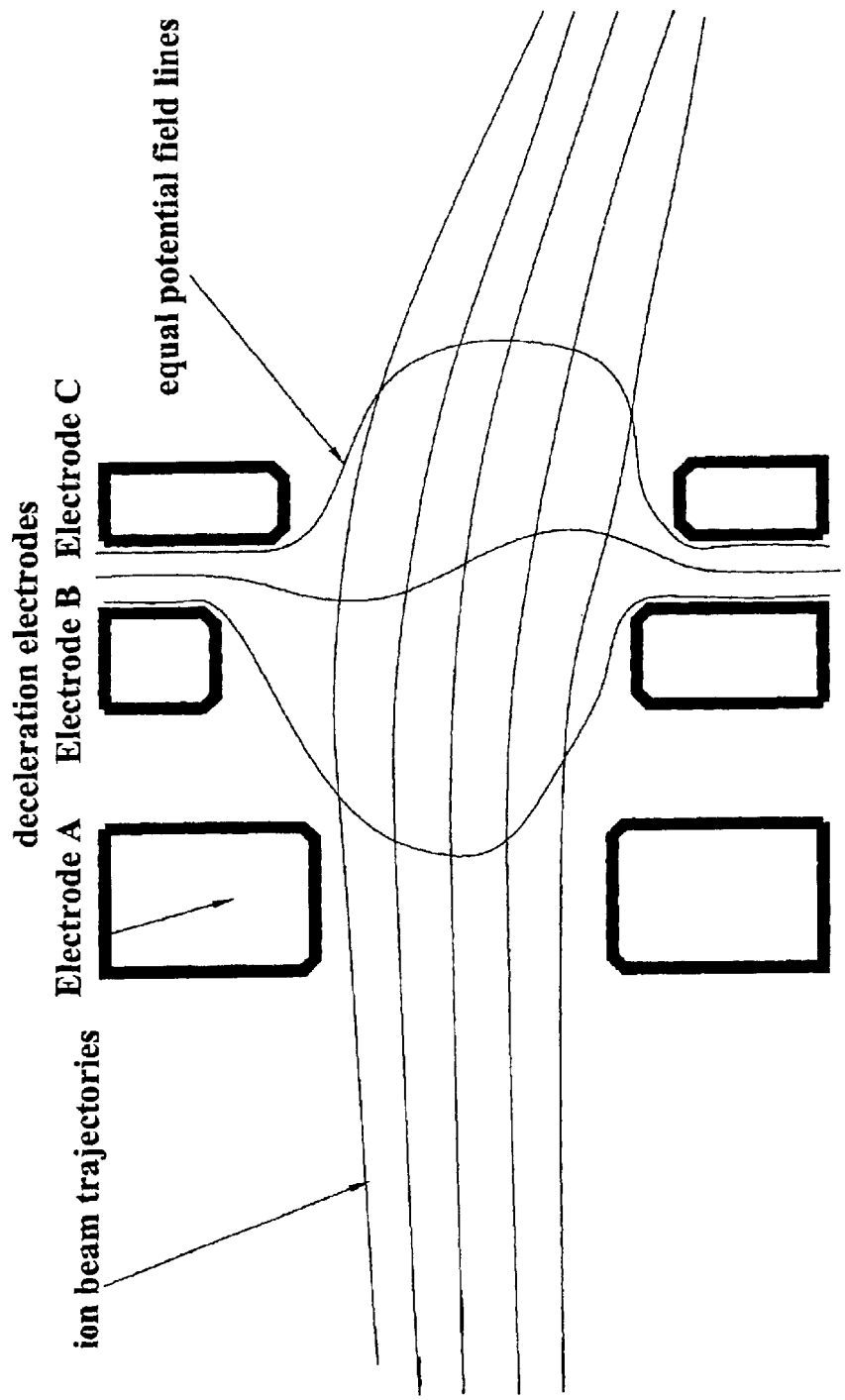
FIG. 4 is the cross-section diagram of the electric field distribution and ion beam trajectories in the deceleration region.

FIGS. 3 and 4 show the schematic diagrams of the deceleration optics 135 and the electrical voltage arrangement of the electrodes employed in the deceleration optics 135 of the present invention. The deceleration optics consists of three electrodes A, B, and C. The voltages of the ion source, the extraction suppression electrode, and the source terminal are shown in FIG. 3 as $V_S$, $V_E$, and $V_T$, respectively, where $V_S$ and $V_T$ are referenced to ground while $V_E$ is referenced on the source terminal. Electrode A is at a potential $V_A$ and is equal to the ion source termination potential $V_T$ ($V_A=V_T$). The deceleration suppression electrode B is at a potential $V_B$ that is more negative than $V_A$ ($V_B<V_A$). Electrode C is at a potential $V_C$ that is equal to the potential of the processed wafers, and is more positive than $V_A$ ($V_A < V_C$). The original ion energy $E_O$ is equal to $q(V_S - V_T) = q(V_S - V_A)$, and the decelerated ion energy $E_F$ is equal to $q(V_S - V_A) - q(V_C - V_A) = q(V_S - V_C)$, where q is the charge of an ion in the beam and is usually positive.

In most ion implanters, it is preferable for the processed wafers to be connected to ground ($V_C = 0$) or nearly so. In this configuration, the ion source power supply is floated or referenced on the source terminal potential which itself is floated or referenced on the ground potential. The resulting energies are, $E_O = q(V_S - V_T)$, $E_F = qV_S$, where, $V_C = 0$, $V_B < 0$, and in decel-mode, $V_T < 0$. Also, the extraction power supply, $V_E < 0$, is referenced on the source terminal and $V_B < V_A = V_T < 0$ is referenced on the ground potential.

Regardless of the configuration, $V_B$ is more negative than $V_A$ and $V_C$ ($V_B < V_A < V_C$), so that Electrode B can suppress both the upstream and downstream electrons. Electrode B also provides focusing while the beam is being decelerated and steered. From the electrode cross-section diagram in FIG. 4, it can be seen that Electrode B and Electrode C can be displaced transversely off the centerline of electrode A. Both the electric field between Electrode A and B and the field between Electrode B and C steer the ion beam downward. Electrodes B and C are controlled by a manipulator and can move transversely to steer the ion beam with the correct angle so that the ion beam can reach the wafer position. The steering angle is a function of the original and final energies of the ion beam and the electric field distribution in the deceleration region. For different original and final energies of the ion beam, the parameters affecting the electric field distribution, including the suppression voltage $V_B$ and the transverse positions of Electrodes B and C, have to change to keep the steering angle unchanged so that the ion beam can reach the same wafer position. Because the suppression voltage $V_B$ is primarily used to focus the ion beam, its value is usually changed to give the proper focusing while the transverse positions of Electrodes B and C are changed to give the proper steering.

The original beam is required to have small beam width for separating the decelerated and steered ion beam with the neutralized beam in a position not far from the deceleration region to significantly reduce energy contamination. Assume that the steering angle is $\theta_O$, the beam width is w for both the neutralized beam and decelerated ion beam, and the travel distance for completely separating the neutralized beam and the steered ion beam is L. The steering angle $\theta_O$ should be maintained small, usually from three degrees to fifteen degrees, to minimize corresponding wafer position change and possible beam current loss. The travel distance L should be short to maximize beam current delivery to the wafer when space charge blow-up occurs for low energy and high current beam. Since the relation among these parameters is approximately $w = L \tan \theta_O$, the beam width is required to be small, too. For instance, when $\theta_O$ is equal to 6 degrees and L equal 30 cm, w will become 3.2 cm.

Considering that large beam cross section is required to minimize space charge blow-up for low energy and high current beam, the beam height should be large when the beam width is limited to be small. In other words, an ion beam with large aspect ratio (or large height-to-width ratio) is required in the deceleration and steering region for successfully separating the decelerated and steered ion beam from the neutralized beam, and transporting the production worthy low energy beam currents. An aspect ratio of 4 is considered to be the minimum requirement for separation of a low energy and high current ion beam from the corresponding neutralized beam. Since the beam width is usually larger than 2.5 cm, the beam height has to be at least 10 cm.

After the neutralized beam is separated from the decelerated ion beam, a beam stop can be applied in the neutralized beam path to prevent the neutrals with higher energy from reaching the wafer and therefore minimize energy contamination.

Figure 5:
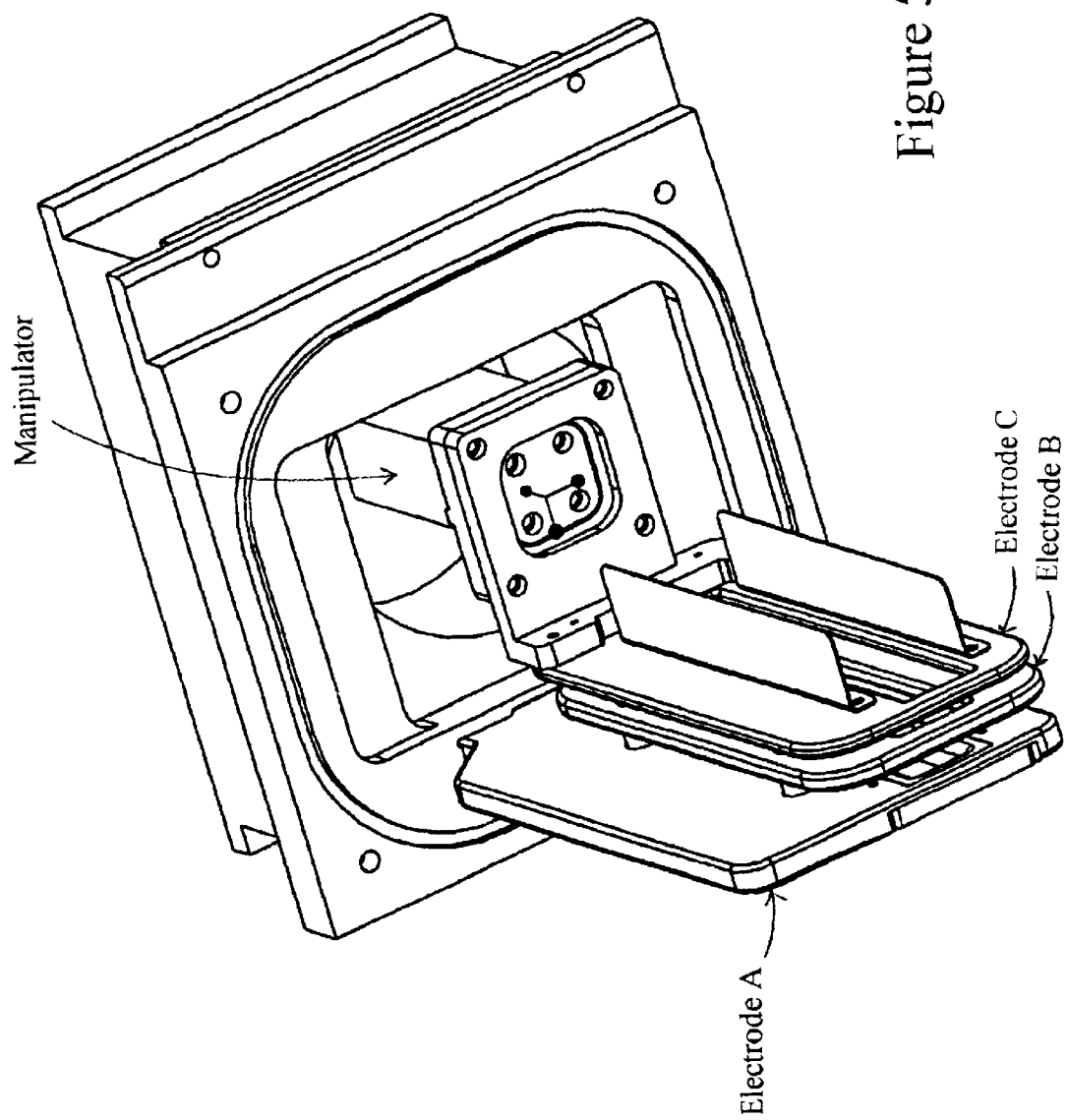
FIG. 5 is a three-dimensional perspective view of the mechanical design of the deceleration electrode assembly.

FIG. 5 shows a three-dimensional perspective view of the mechanical design of the deceleration electrode assembly. The apertures of the three electrodes are narrow and tall because they are designed to decelerate narrow and tall beams, or high aspect ratio beams as discussed above. Electrode B has a larger width than Electrode A and C to prevent ion beams from striking on Electrode B, generating large secondary electron emissions, and thereby overloading the suppression power supply. Another reason is to provide a better focusing field distribution. When the width of Electrode B is smaller than that of Electrode C, the transverse field components at the edge of Electrode C is high, which may inappropriate deflection of the beam.

The deceleration optics of the present invention provides an apparatus to decelerate ion beams and at the same time steer these decelerated beams off the path of the original ion beams. In this way, the decelerated ion beam is steered in the target direction and the neutralized beam travels in the direction of the original ion beam. By blocking the neutralized beams with a beam stop, the energy contamination resulting from deceleration can be eliminated.

Figure 6:
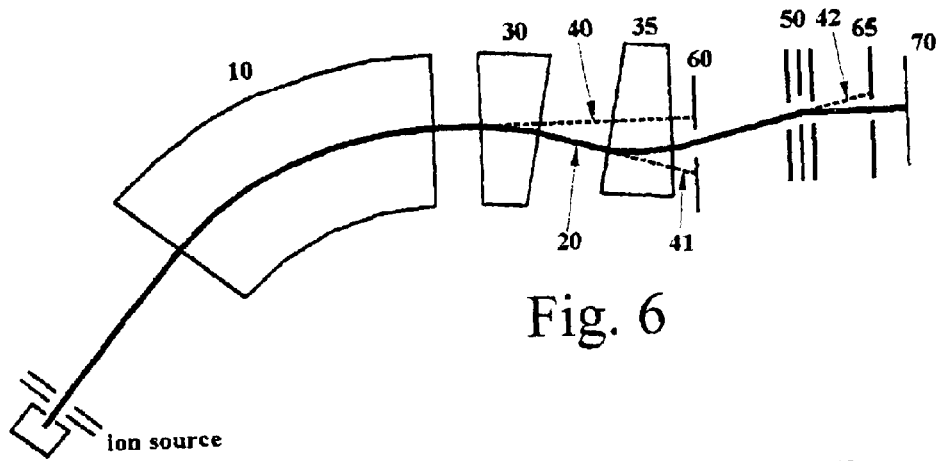
FIG. 6 is a functional block diagram of an improved ion implantation system of this invention.

The present invention teaches a novel low-energy ion implant system with reduced energy contamination by guiding and steering the ions particles to transmit in a new ion beamline by decelerating and deflecting the charged ion beam to separate from the neutralized component, or neutral fraction, from the main ion beam. The ion deceleration and deflection are accomplished by combination of magnetic deflection and electric deceleration/deflection as shown in FIG. 6. The ion implant system includes an ion source that has ion-beam formation electrodes and the mass analyzer magnet 10. The charged ion particles emerge from the mass analyzer magnets 10. Some of these charged particles become neutralized particles due to the charge exchange processes. The charged particle beam 20 is deflected by the energy filtration magnets 30 and 35 and travels towards the deceleration electrodes 50 where the charged particle beam is decelerated and steered back towards the implant target 70. Such deceleration electrodes 50 are discussed in the U.S. patent application Ser. No. 09/516,663. The prior application Ser. No. 09/516,663 filed on Mar. 1, 2000 assigned to a common Assignee is hereby incorporated as reference for this Application. The neutral beams 40 and 41, which are separated from the charged particle beam 20 when the beam 20 is deflected by magnets 30 and 35, are blocked by the beam stopper 60 and will not reach the target 70. The neutral beam 42 is unaffected by the decelerating electric fields in the region of the deceleration electrodes 50 and propagates in the same direction as the initial beam before declaration. The charged particle beam 20 is decelerated and deflected toward the target 70 by the deceleration electrodes 50. An aperture 65 in front of the target 70 collimates the charged particle beam 20 and stops the neutral particles before reaching the target wafer or target chamber. Energy contamination resulting from neutralized particles incident to the target with higher than desired energies is thus resolved.

In comparison to the prior art disclosed by England, the system configurations presented in this invention do not require any magnet between the deceleration electrodes 50 and the implant target 70. In this invention, the distance between the electrodes 50 and the target 70 can be kept very short for the purpose of increasing low energy ion beam currents at the target.

The essence of the present invention is to establish a magnetic field between the mass analyzer magnet and the deceleration electrodes to deflect the ion beam off the original path and back to the deceleration electrodes with an incident angle. The deceleration electrodes decelerate and deflect the ion beam back to the original path toward the target. One advantage of the present invention is to enable the decelerated ion beam to have the same beam direction and position at the target as the original drift beam so that the target position does not need to change when the beam is switched from normal mode to deceleration mode. The other advantage of the present invention is to place neutral beam stopper in one or more positions when the charged beam is decelerated to block the neutralized particles from reaching the target and therefore minimize energy contamination of the target.

Figure 7:
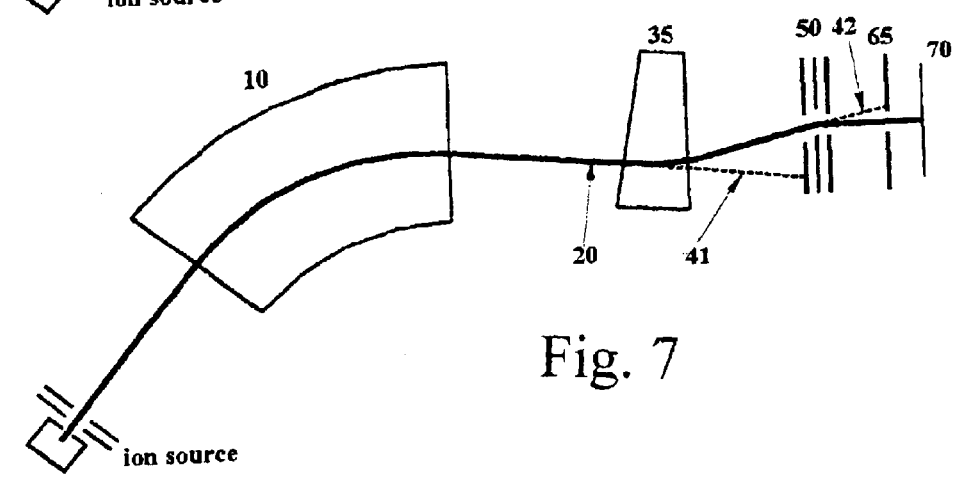
FIG. 7 is a functional block diagram of another ion implantation system of this invention.
Figure 8:
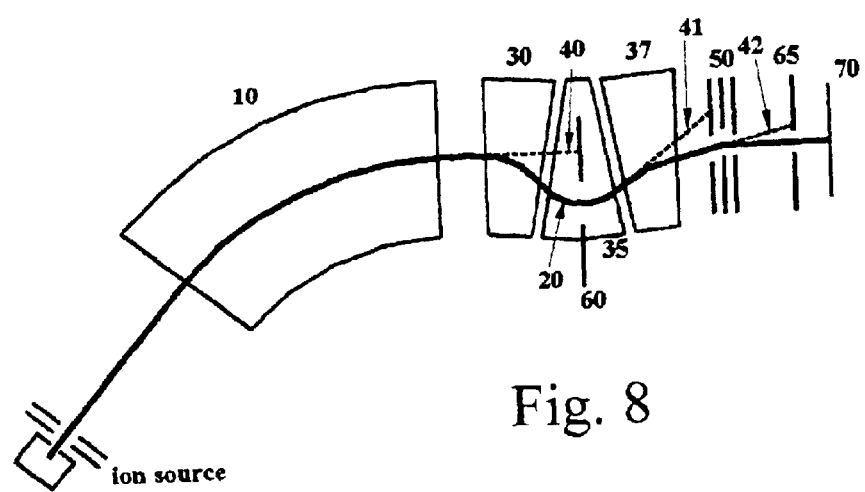
FIG. 8 is another functional block diagrams for showing an alternate ion implant system of this invention.

One or more magnets can be employed to form the magnetic field between the mass analyzer and the deceleration electrodes in the present invention for beam deflection. The method discussed above in FIG. 6 shows a specific example of the present invention using two magnets. FIGS. 7 and 8 show the methods using one and three magnets respectively. In FIG. 2, adjusting the field strength of the mass-analyzer magnet 10 results in a displacement at the entrance of the deflection magnet 35. The magnet 35 produces a magnetic field to steer the beam back to the center position at the entrance of the deceleration electrodes 50. The ion beam 20 is decelerated, deflected and then propagates at a direction near perpendicular to the target surface. This approach couples tuning of both the mass analyzer magnet and the deflection magnet, which increases complicity of controlling beam optics. In FIG. 8, magnets 30, 35, and 37 act together to deflect the charged ion beam 20 off the original path and back to the entrance of the deceleration electrodes 50 at the desired angle. This method gives more flexibility for beam control so that we can reduce the distance between the deflection magnets and the deceleration electrodes.

Figure 9:
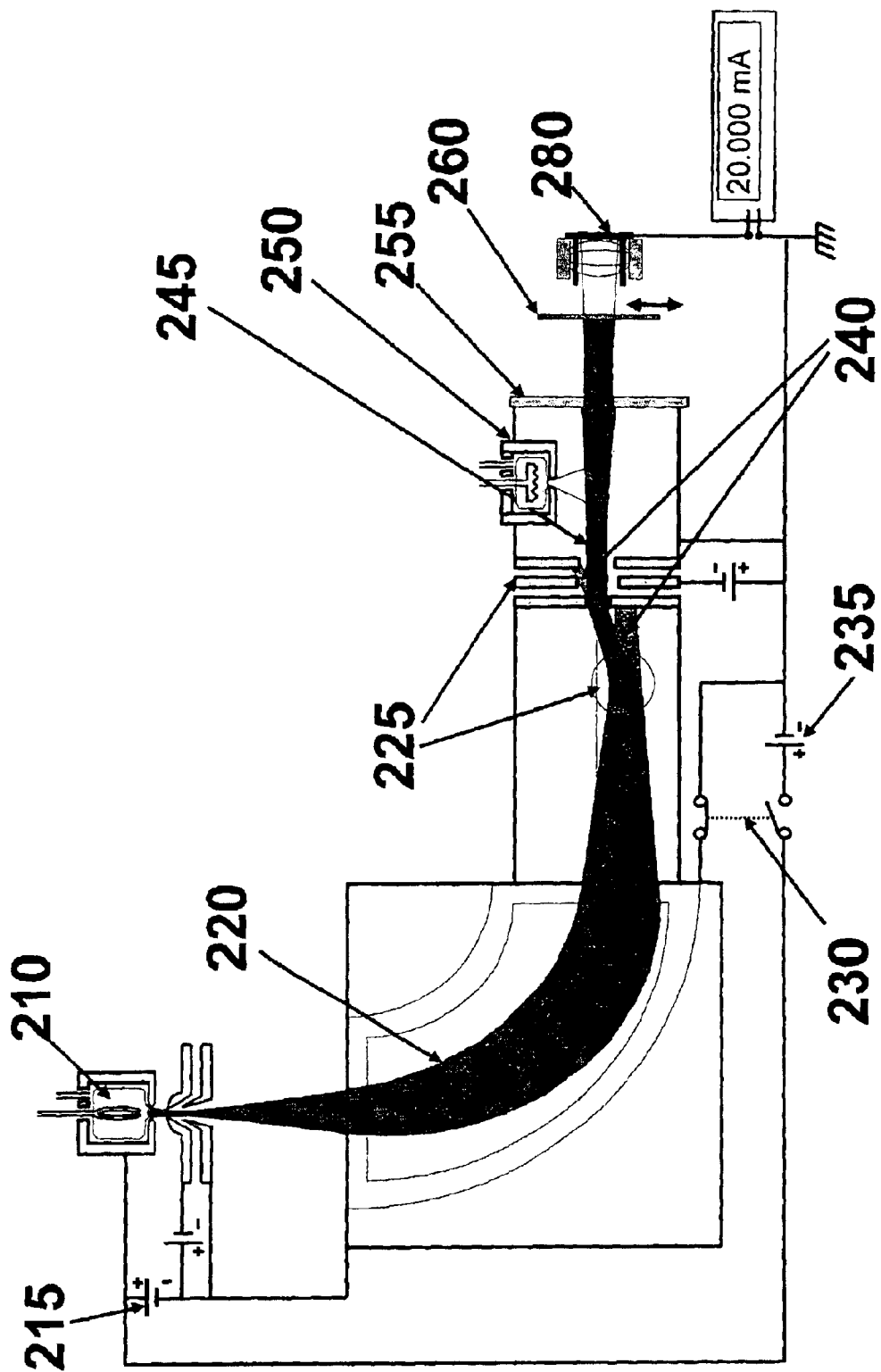
FIG. 9 is a side cross sectional view of an improved implanter of this invention that includes a movable striking plate of this invention.

FIG. 9 is a functional block diagram for illustrating a implantation apparatus 200 of the present invention. The ion implanter 200 includes a ion source placed inside an ion source chamber 210 connected to an extraction voltage source 215 for extracting ions either at a drift mode or at a deceleration mode for projecting an ion beam to a beam analyzer 220 provided with a ninety-degree analyzer magnet. As the ion beam is guided to travel through the mass analyzer 220, the energy of the ion beam is control by a switch 230 for switching between a drift mode and a deceleration mode and by a final energy power source 235. The analyzer magnet 220 guides the ion beam to project along a bended trajectory to a set of detour magnet/deceleration electrodes 225 of this invention as described above where the neutral particles 240 are stopped and filtered out. The detour magnet/deceleration electrodes 225 decelerate the ion beam to a final energy level to project through a plasma shower 250 for carrying out a beam neutralization process and passing through a beam aperture 255 before the beam reached the target wafer 260 that is moved in and out of the beam thus scanned by the ion beam for implantation.

Figure 10A:
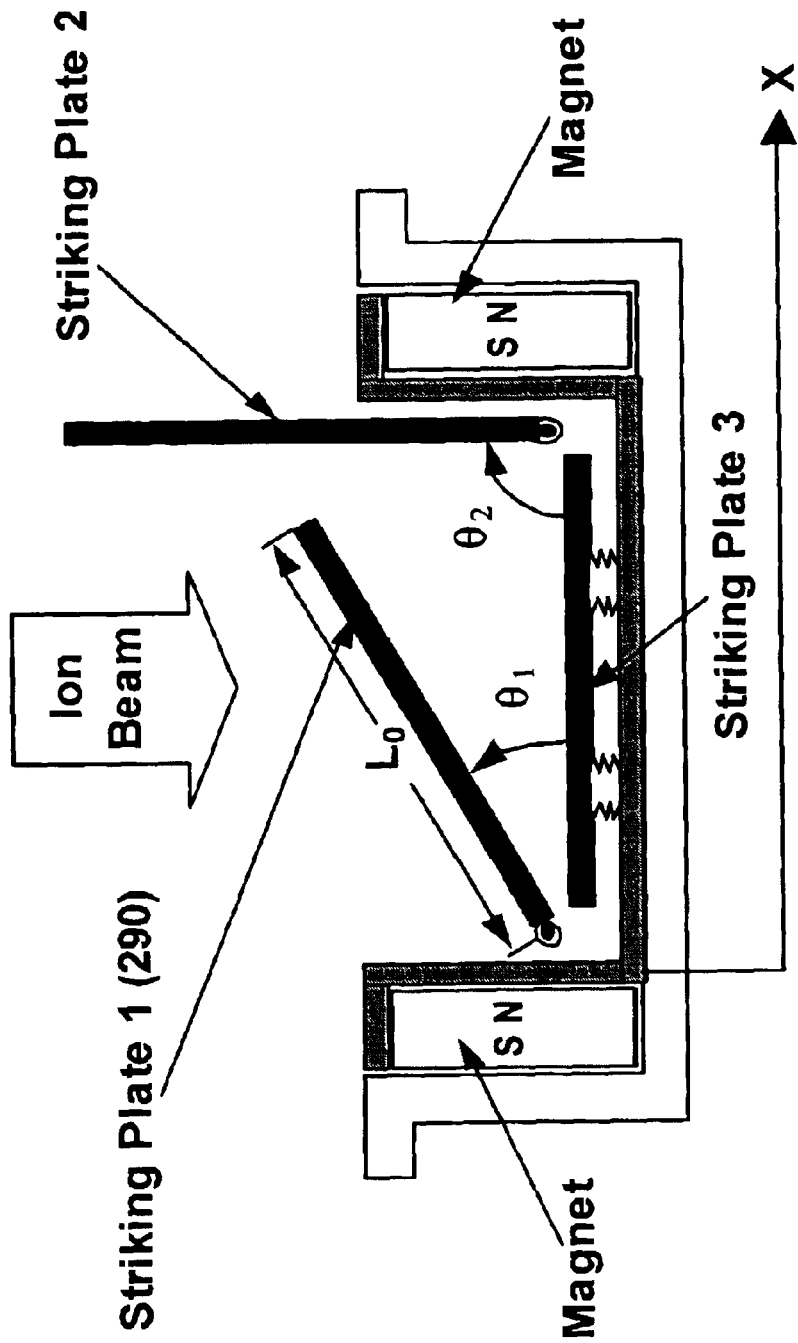
FIG. 10A is a cross sectional view of a new Faraday implemented with multiple position-adjustable striking plates of this invention.
Figure 10B:
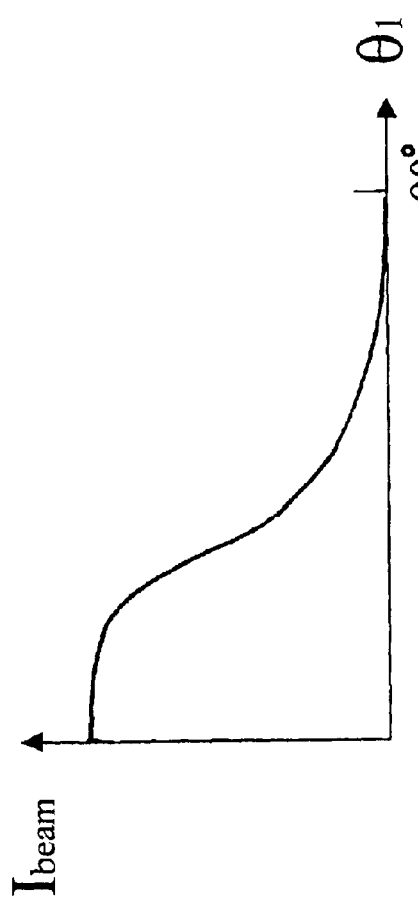
FIG. 10B is a diagram for illustrating the ion beam current measurement as function of the angular position of the striking plate for measuring and adjusting the ion beam incident angle.
Figure 10C:
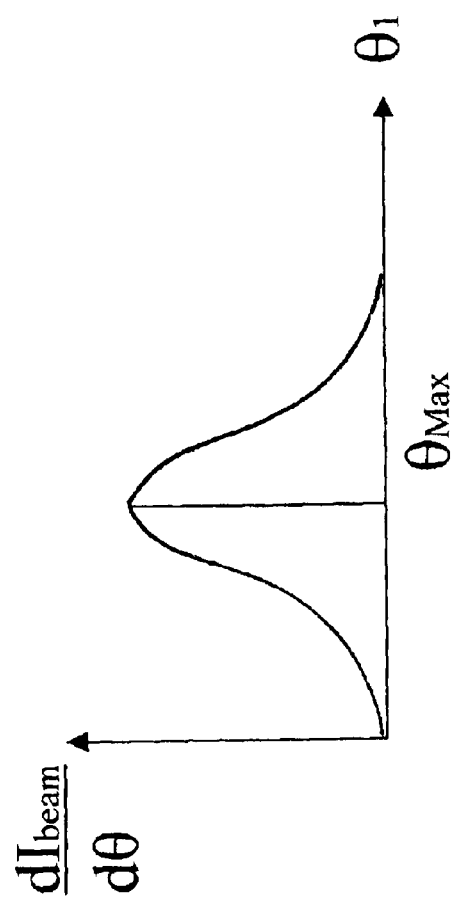
FIG. 10C is a diagram for illustrating differential of the ion beam current measurement as function of the angular position of the striking plate.

The implanter 200 further includes a Faraday 280 to perform a special function of measuring the beam incident angle by providing multiple position adjustable striking plates 290 as further illustrated in FIG. 10A. The Faraday 280 includes a plurality of striking plates 290 that can rotate at different angular position θ. FIG. 10B shows the ion beam current measured on the striking plate 290 as the striking plate 290 is rotated from a horizontal position ($\theta=0°$) gradually to a vertical position ($\theta=90°$), FIG. 10C illustrates differential results of the beam current as shown in FIG. 10B. The differential results represent the beam current density relative to the striking plate angular positions. For the purpose of adjusting the incident beam such that the beam trajectory is perpendicular to the wafer 260, the maximum beam current density should be measured when the striking plate 290 is rotated from horizontal position, i.e., $\theta=0°$ to a vertical position, i.e., $\theta=90°$. When an angular position at maximum beam current density, $\theta_{MAX}$ is measured at an angle that is different from $\theta=90°$, as that shown in FIG. 10C. The angular position, can be converted to spatial position relative to the Faraday horizontal position, $X=L\cos(\theta)$ as indicated in FIG. 10A, where L is width of the striking plate. The corresponding maximum beam current density spatial position is $X_{MAX}$. The position, $X_{MAX}$ has to be aligned up with an aperture of the detour magnet/deceleration electrodes 225 and the aperture 255 in front of the wafer 260 so that the beam trajectory is nearly perpendicular to the wafer 260. The mass analyzer 210 and/or the detour-deceleration electrodes 225 can be adjusted to move the $X_{MAX}$ to a desired position. Therefore, the incident angle of the ion beam to the wafer can be accurately measured and controlled.

The Faraday is further provided with multiple striking plates 290 and each striking plates can be used for a specific ion species such as, boron, phosphorus, or arsenic. In an ion implanter beam utilization is less than 50% and rest portion of an ion beam terminates on a beam dumper. The striking plates described here can also function as the beam dumpers. The striking plates, or beam dumpers can be implanted or deposited with one or more molecules or atoms during implants. These implanted or deposited atoms/molecules can also be sputtered out by ion beam striking. The sputtered atoms can land on the wafers and cause species cross contaminations. The most effective way is to use dedicated striking plates for each implanted ion species. An exemplary embodiment of this invention as shown introduces three striking plates three most commonly used species for ion implantation, e.g., boron, phosphorous, and arsenic. Therefore, the striking plates as now implemented in the Faraday 280 provides dual functions of incident angle measurement and also for cross contamination reductions.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. An ion implantation apparatus comprising an ion source for extracting an ion beam to travel along an original ion beam path for implanting a target wafer, said apparatus further comprising:

a set of deceleration electrodes disposed along said original ion beam path before said target wafer for decelerating and deflecting said ion beam to said target wafer; and a charged particle deflecting means disposed between said ion source and said set of deceleration electrodes for deflecting said ion beam away from an original ion beam path and projecting to said set of electrodes with an incident angle relative to said original ion beam path for said set of electrodes to apply an electrical field to deflect said ion beam back to said original ion beam path for implanting said target wafer.

2. The ion implantation apparatus of claim 1 further comprising:

a neutral particle blocking means disposed right after said set of electrodes for blocking a neutral particle beam for preventing said neutral particle beam from reaching said target wafer.

3. The ion implantation apparatus of claim 2 wherein: said neutral particle blocking means comprising at least one neutral beam stopper.

4. The ion implantation apparatus of claim 1 wherein: said charged particle deflecting means generating a magnetic field between said ion source and said set of deceleration electrodes for deflecting said ion beam away from original ion beam path and projecting to said set of electrodes with an incident angle relative to said original ion beam path for said set of electrodes to apply an electric field to deflect said ion beam back to said original ion beam path for implanting said target wafer.

5. The ion implantation apparatus of claim 4 wherein: said charged particle deflecting means comprising a magnet for generating said magnetic field for filtering said ion beam.

6. The ion implantation apparatus of claim 4 wherein: said charged particle deflecting means comprising at least two magnets for generating said magnetic field for filtering said ion beam.

7. The ion implantation apparatus of claim 1 wherein: said ion source further comprising an analyzer magnet for extracting said ion beam to travel along said original ion beam path.

8. The ion implantation apparatus of claim 1 wherein: said set of deceleration electrodes further comprising a plurality of electrodes for filtering said charged particles of said ion beam for generating a spread-out ion beam over an angular range along a beam line of said ion beam according to an energy of each ion of said ion beam for more accurately controlling said energy of said ions for implantation.

9. The ion implantation apparatus of claim 1 further comprising:

a neutral particle stopper disposed immediately after said set of electrodes for blocking a plurality of neutral particles in said ion beam from reaching said target wafer.

10. The ion implantation apparatus of claim 8 wherein: said set of deceleration electrodes comprising a first, second and third electrodes arranged in sequence along an incident direction of said ion beam deflected by said charged particle deflecting means with an incident angle relative to said original path of said ion beam for generating an ion-beam filtering electric field wherein said second electrode is provided with a more negative voltage than said first electrode and said third electrode is provided with a more positive voltage than said first electrode.

11. A method for implanting a target wafer with ions extracted from an ion source traveling along an original ion beam path, said method further comprising steps of:

employing a set of deceleration electrodes disposed along said original ion beam path before said target wafer for decelerating and deflecting said ion beam to said target wafer; and employing a charged particle deflecting means disposed between said ion source and said set of deceleration electrodes for deflecting said ion beam away from original ion beam path and projecting to said set of electrodes with an incident angle relative to said original ion beam path for said set of electrodes to apply an electric field to deflect said ion beam back to said original ion beam path for implanting said target wafer.

12. The method of claim 11 further comprising:

disposing a neutral particle blocking means right after said set of electrodes for blocking a neutral particle beam for preventing said neutral particle beam from reaching said target wafer.

13. The method of claim 12 wherein:

said method of disposing a neutral particle blocking means comprising a step of disposing at least one neutral beam stopper right after said set of electrodes.

14. The method of claim 11 wherein:

said step of employing said charged particle deflecting means comprising a step of generating a magnetic field between said ion source and said set of deceleration electrodes for deflecting said ion beam away from said original ion beam path and projecting to said set of electrodes with an incident angle relative to said original ion beam path for said set of electrodes to apply an electric field to deflect said ion beam back to said original ion beam path for implanting said target wafer.

15. The method of claim 14 wherein:

said step of generating said magnetic field comprising a step of disposing a magnet for generating said magnetic field for filtering said ion beam.

16. The ion method of claim 14 wherein:

said step of generating said magnetic field comprising a step of disposing at least two magnets for generating said magnetic field for filtering said ion beam.

17. The method of claim 11 wherein:

said method of extracting ions from an ion source ion source further comprising a step of employing an analyzer magnet for extracting said ion beam to travel along said original ion beam path.

18. The method of claim 11 wherein:

said step of employing said set of deceleration electrodes further comprising a step of employing a plurality of electrodes for filtering said charged particles of said ion beam for generating a spread-out ion beam over an angular range along a beam line of said ion beam according to an energy of each ion of said ion beam for more accurately controlling said energy of said ions for implantation.

19. The method of claim 11 further comprising:

disposing a neutral particle stopper immediately after said set of electrodes for blocking a plurality of neutral particles in said ion beam from reaching said target wafer.

20. The method of claim 18 wherein:

said step of employing said set of deceleration electrodes comprising a step of employing a first, second and third electrodes arranged in sequence along an incident direction of said ion beam deflected by said charged particle deflecting means with an incident angle relative to said original path of said ion beam for generating an ion-beam filtering electric field wherein said second electrode is provided with a more negative voltage than said first electrode and said third electrode is provided with a more positive voltage than said first electrode.

21. The method of claim 18 wherein:
said step of employing said set of deceleration electrodes comprising a step of transversely moving at least one of said deceleration electrodes to control said electrical field to obtain proper energy filtration effects.

22. An ion implantation apparatus for projecting an ion beam to a target wafer comprising:
a stationary Faraday disposed behind said target wafer for receiving said ion beam projected toward said target wafer wherein said Faraday further includes a movable ion beam incident angle measurement means for determining an incident angle of said ion beam projected to said target wafer.

23. An ion implantation apparatus for projecting an ion beam to a target wafer comprising:
a Faraday disposed behind said target wafer for receiving said ion beam projected toward said target wafer wherein said Faraday further includes an ion beam incident measuring means comprising a movable beam current measuring means for moving to different position for scanning by said ion beam to measure a beam current at different positions when moving across said cross section of said ion beam.

24. The ion implantation apparatus of claim 23 wherein:
said movable beam current measuring means further includes a movable striking plate for moving to different positions for scanning said ion beam to measure a beam current at different positions when moving to different positions relative to said ion beam.

25. The ion implantation apparatus of claim 23 wherein:
said movable beam current measuring means further includes a plurality of movable striking plates wherein each of said striking plates is provided for moving to different positions for scanning said ion beam to measure a beam current at different positions when moving to different positions relative to said ion beam.

26. The ion implantation apparatus of claim 23 wherein:
said movable beam current measuring means further includes a movable striking plate hinged on said Faraday for rotating across and scanned by said ion beam to measure a beam current at different rotation angle when rotating across said ion beam.

27. The ion implantation apparatus of claim 23 wherein:
said movable beam current measuring means further includes a plurality movable striking plates each hinged on said Faraday for rotating across and scanned by said ion beam to measure a beam current at different rotation angle when each of said striking plates rotating across said ion beam.

* * * * *